United States Patent
Litjes et al.

(10) Patent No.: US 12,355,454 B2
(45) Date of Patent: Jul. 8, 2025

(54) SYSTEM AND METHOD OF EXTENDING INPUT RANGE OF ANALOG TO DIGITAL CONVERTER

(71) Applicant: NXP B.V., Eindhoven (NL)

(72) Inventors: Alphons Litjes, Zijtaart (NL); Erik Olieman, Waalre (NL)

(73) Assignee: NXP B.V., Eindhoven (NL)

( * ) Notice: Subject to any disclaimer, the term of this patent is extended or adjusted under 35 U.S.C. 154(b) by 251 days.

(21) Appl. No.: 18/205,250

(22) Filed: Jun. 2, 2023

(65) Prior Publication Data

US 2024/0405780 A1     Dec. 5, 2024

(51) Int. Cl.
| H03M 1/06 | (2006.01) |
| H03M 1/08 | (2006.01) |
| H03M 1/12 | (2006.01) |
| H03M 1/20 | (2006.01) |
| H03M 1/38 | (2006.01) |
| H03M 1/46 | (2006.01) |
| H03M 1/80 | (2006.01) |

(52) U.S. Cl.
CPC ........... *H03M 1/0604* (2013.01); *H03M 1/08* (2013.01); *H03M 1/129* (2013.01); *H03M 1/208* (2013.01); *H03M 1/38* (2013.01); *H03M 1/466* (2013.01); *H03M 1/468* (2013.01); *H03M 1/804* (2013.01)

(58) Field of Classification Search
CPC .... H03M 1/0604; H03M 1/804; H03M 1/129; H03M 1/208; H03M 1/466; H03M 1/468; H03M 1/08; H03M 1/38

USPC .......................................... 341/118, 120, 172
See application file for complete search history.

(56) References Cited

U.S. PATENT DOCUMENTS

| 6,731,232 | B1 | 5/2004 | Kearney |
| 9,859,911 | B1 | 1/2018 | Chen et al. |
| 9,923,569 | B1 * | 3/2018 | Chen ...................... H03M 1/10 |
| 10,116,323 | B2 | 10/2018 | Tsai |
| 10,630,310 | B1 | 4/2020 | Litjes et al. |
| 12,088,317 | B2 * | 9/2024 | Park ...................... H03M 1/127 |
| 2003/0184464 | A1 | 10/2003 | Nakamura et al. |

OTHER PUBLICATIONS

Shen, Y., "A 2.2 fJ/Conversion-Step 9. 7 4-ENOB 10 MS/s SAR ADC With 1.5x Input Range", IEEE Transactions on Circuits and Systems—II: Express Briefs, vol. 69, No. 9, Sep. 2022.

(Continued)

*Primary Examiner* — Khai M Nguyen (57) ABSTRACT

An analog to digital converter including a digital to analog converter (DAC), a comparator, and a controller. The DAC includes a sample node and a capacitor array controlled by a digital control input. The comparator compares a voltage of the sample node with a reference voltage to generate a comparison value. The controller presets the digital control input, prompts the DAC to sample the input voltage onto the sample node, resets the digital control input, and performs a conversion by successively adjusting the digital control input based on the comparison value to determine a digital output. A preset value is subtracted from the digital output to provide an adjusted digital output. A sample predictor predicts the next sample to determine the preset value used to adjust the sample node within a full scale range after DAC reset.

20 Claims, 7 Drawing Sheets

(56) References Cited

OTHER PUBLICATIONS

Shen, Yuting et al. "A 103dB-SFDR Calibration-Free Oversampled SAR ADC with Mismatch Error Shaping and Pre-Comparison Techniques." *IEEE Journal of Solid-State Circuits*, vol. 57, No. 3, pp. 734-744, Mar. 2022, doi:10.1109/JSSC.2021.3135559.

Shu, Yun-Shiang et al. "An Oversampling SAR ADC with DAC Mismatch Error Shaping Achieving 105 dB SFDR and 101 dB SNDR Over 1 kHz BW in 55nm CMOS." *IEEE Journal of Solid-State Circuits*, vol. 51, No. 12, pp. 2928-2940, Dec. 2016.

Yang, Chuanshi et al. "An Area-Efficient SAR ADC With Mismatch Error Shaping Technique Achieving 102-dB SFDR 90.2-dB SNDR Over 20-kHz Bandwidth." *IEEE Transactions on Very Large Scale Integration (VLSI) Systems*, vol. 29, No. 8, pp. 1575-158,. Aug. 2021.

Yang, Chuanshi et al. "A 98.6 dB SNDR SAR ADC with a Mismatch Error Shaping Technique Implemented with Double Sampling." *IEEE Transactions on Circuits and Systems II: Express Briefs*, vol. 69, No. 3, pp. 774-778, Mar. 2022, doi: 10.1109/TCSII.2021.3112501.

Liu, Jiaxin et al. "A 40kHz-BW 90dB-SNDR Noise-Shaping SAR with 4xPassive Gain and 2nd Order Mismatch Error Shaping." 2020 IEEE International Solid-State Circuits Conference (ISSCC), Feb. 2020. pp. 158-160 Doi: 10.1109/ISSCC19947.2020.9063159.

Shu, Yun-Shiang et al. "An Oversampling SAR ADC with DAC Mismatch Error Shaping Achieving 105dB SFDR and 101dB SNDR over 1kHz BW in 55nm CMOS." 2016 IEEE International Solid-State Circuits Conference, Feb. 2016, pp. 458-460.

\* cited by examiner

SYSTEM AND METHOD OF EXTENDING INPUT RANGE OF ANALOG TO DIGITAL CONVERTER

BACKGROUND

Field of the Invention

The present invention relates in general to analog to digital conversion, and more particularly to a system and method of extending the input range of an analog to digital converter by pre-setting the digital to analog converter (DAC) using available DAC weights during a sampling phase to increase input range.

Description of the Related Art

A top-plate sampling charge redistribution, successive approximation register (CR-SAR) analog to digital converter (ADC) operated in a conventional manner has the disadvantage of an attenuated input range due to parasitic capacitance on the top capacitive plate (among other conversion issues) which have a negative impact on the SNDR (Signal to Noise-and-Distortion Ratio) and the corresponding effective number of bits (ENOB).

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A charge redistribution, successive approximation register (CR-SAR) analog to digital converter (ADC) incorporates a top-plate sampling digital to analog converter (DAC) that samples an analog input voltage during each of successive sampling cycles. In each sampling cycle, the ADC predicts the next input sample and "presets" the sampling DAC accordingly by adjusting the digital control values to effectively add a digital offset during input sampling. The digital control values of the DAC are then reset back to their normal initial values and normal SAR conversion is performed to determine a first digital output value. A digital preset value corresponding with the digital offset is subtracted from the first digital output value to provide a final or adjusted digital output value.

Figure 1:
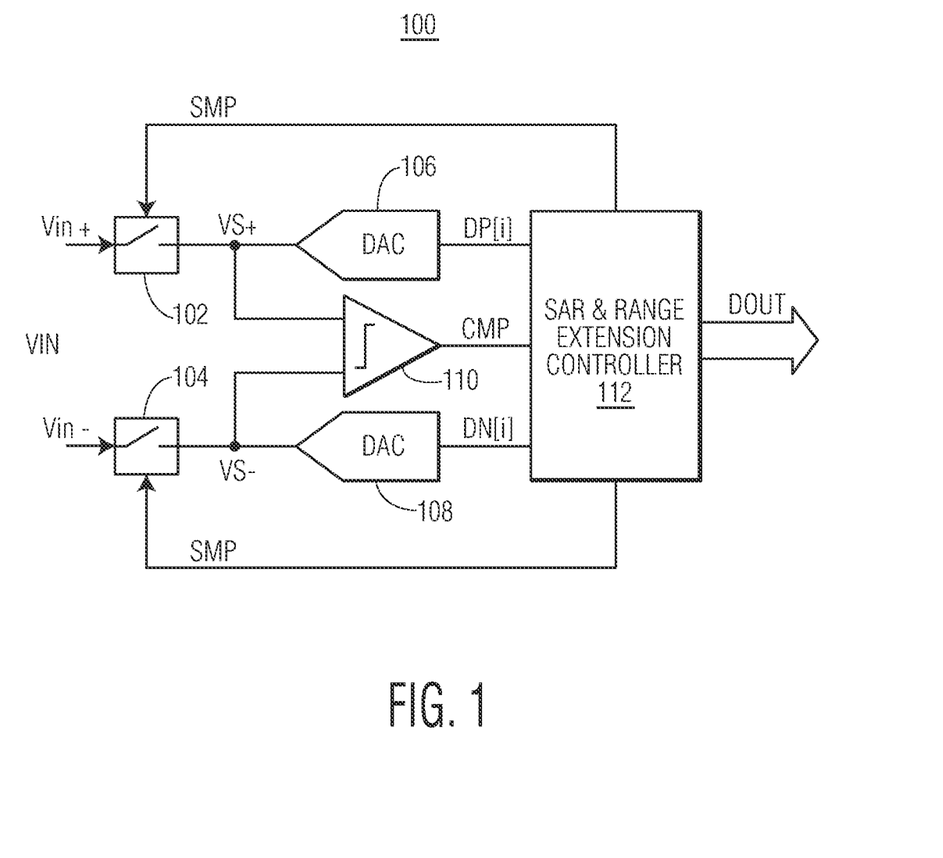
FIG. 1 is a simplified block diagram of a differential CR-SAR ADC configured with input range extension according to one embodiment.

FIG. 1 is a simplified block diagram of a differential CR-SAR ADC 100 configured with input range extension according to one embodiment. A differential analog input voltage (VIN) includes a positive polarity VIN+ and a negative polarity VIN− which are provided to corresponding inputs of a pair of sample switches 102 and 104. In response to a sample control signal SMP, VIN+ is sampled by a first digital-to-analog converter (DAC) 106 which develops a positive sample voltage VS+ and VIN− is sampled by a second DAC 108 which develops a negative sample voltage VS−. VS+ and VS− are provided to respective inputs of a comparator 110, having an output providing an input compare value CMP to an input of a SAR and range extension controller 112. The SAR and range extension controller 112 asserts the SMP signal to periodically sample VIN (such as every sample clock cycle or the like) and then performs successive approximation based on the CMP value. In particular, the SAR and range extension controller 112 updates a set of positive digital control values DP[i] provided to an input of the DAC 106 and updates another set of negative digital control values DN[i] provided to an input of the DAC 108 based on the CMP value. In this manner, the SAR and range extension controller 112 performs a conversion of VIN to output a corresponding digital output value DOUT.

In conventional operation of the differential CR-SAR ADC 100 without range extension, the SAR and range extension controller 112 initially asserts DP[i] and DN[i] to reset values to place the DACs 106 and 108 in an initial reset state. The SAR and range extension controller 112 then toggles SMP so that VIN is sampled by the DACs 106 and 108 to generate initial values of the VS+ and VS− sample voltages. The SAR and range extension controller 112 then performs successive approximation register (SAR) conversion by adjusting DP[i] and DN[i] one bit at a time while monitoring CMP to eventually develop a digital value that is provided or otherwise converted to DOUT. The conventional operation of the ADC 100, however, suffers from an attenuated input range due to parasitic capacitance on the top-plate of each of the DACs 106 and 108, which reduces the effective number of bits (ENOB). When the input voltage is outside the attenuated range, the input voltage may be scaled prior to SAR conversion which has a negative impact on the SNDR (Signal to Noise-and-Distortion Ratio). In one embodiment, for example, the conventional operation causes a 10-30% full scale range (FSR) loss.

The SAR and range extension controller 112 is modified relative to the conventional configuration to achieve input range extension to extend the operative range beyond the standard FSR. When operating with range extension as further described herein, instead of initially resetting the DACs 106 and 108 for sampling, the SAR and range extension controller 112 initially presets both DACs 106 and 108 by modifying both DP[i] and DN[i] with a digital preset value. While both of the DACs 106 and 108 are pre-charged with the preset values, the SAR and range extension controller 112 asserts SMP to sample VIN into the DACs 106 and 108. Then the SAR and range extension controller 112 "resets" the DACs 106 and 108 by returning both DP[i] and DN[i] to their reset values while both remain charged with respective VIN samples. Then the SAR and range extension controller 112 performs the SAR conversion process to generate a "preliminary" output value PDOUT, and then subtracts a corresponding preset value from PDOUT to generate an adjusted or final digital output DOUT.

The initial pre-setting of the DP[i] and DN[i] values effectively adds a digital offset or preset value to the DACs 106 and 108 during sampling. The magnitude and direction of the preset value may be based on a prediction of the input sample as further described herein. When a magnitude of the analog input signal is greater than the standard FSR of the ADC, the preset is added to enable sampling within the operating range of the DACs. It is appreciated that the analog input signal is not attenuated prior to conversion thereby maintaining input signal integrity. After conversion, the preset value is subtracted to provide an accurate digital representation of the input sample. It is noted that initial "adding" of the digital offset may be implemented as adding a positive or a negative value, in which the digital offset value is then subtracted from the first digital value to provide the adjusted digital output value.

Figure 2:
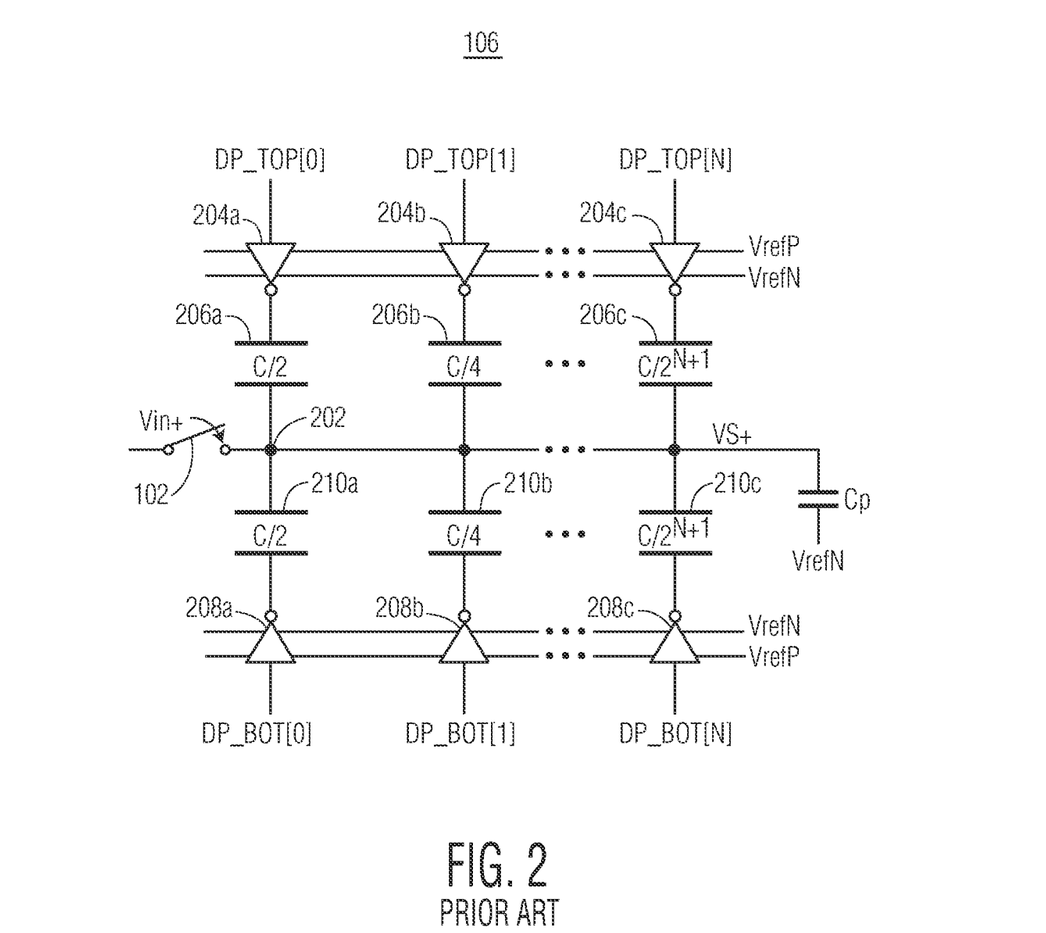
FIG. 2 is a schematic diagram of the DAC of FIG. 1 configured as a top-sampling differential split-capacitor DAC according to one embodiment.

FIG. 2 is a schematic diagram of the DAC 106 configured as a top-sampling differential split-capacitor DAC according to a conventional configuration. The sample switch 102 receives VIN+ and has a terminal coupled to a sample node 202 of the DAC 106 which develops the sample voltage VS+. The positive digital values DP[i] are subdivided into N+1 top signals DP_TOP[0], DP_TOP[1] ..., DP_TOP[N] and N+1 bottom signals DP_BOT[0], DP_BOT[1], ..., DP_BOT[N], in which N is any suitable positive integer for achieving a desired DAC resolution. The top signals DP_TOP[0 ... N] are provided to respective inputs of N+1 inverting drivers 204a, 204b, ..., 204c having outputs coupled to respective terminals (or plates) of N+1 capacitors 206a, 206b, ..., 206c. In a similar manner, the bottom signals DP_BOT[0 ... N] are provided to respective inputs of N+1 inverting drivers 208a, 208b, ..., 208c, having outputs coupled to respective terminals of another set of N+1 capacitors 210a, 210b, ..., 210c. The opposing terminals of each of the capacitors 206a-206c and 210a-210c are coupled to the sample node 202. Each of the inverting drivers 204a-204c and 210a-210c switch between the polarities VrefP and VrefN of a differential reference voltage.

In the illustrated configuration, the capacitors 206a-206c and the capacitors 210a-210b each have a capacitance based on a capacitance C in which the array of capacitors form a binary capacitance distribution C/2, C/4, ..., C/$2^{N+1}$ from a most significant bit numbered "0" to a least significant bit numbered "N". A parasitic capacitance Cp is shown coupled between the sample node 202 and VrefN. It is noted that the illustrated binary distribution is exemplary only and that many alternative distribution configurations including non-binary distributions are possible and contemplated. Although not explicitly shown, the DAC 108 may be configured in substantially identical manner as controlled by the negative digital values DN[i] for developing the negative polarity sample voltage VS− and is not further described. In addition, the DAC configuration shown in FIG. 2 is exemplary only, in which it is understood that many different alternative top sampling DAC configurations may be used.

It is appreciated that the DACs 106 and 108 may be configured in a conventional manner, such as that shown in FIG. 2, yet operated in a new manner as described herein to achieve overall range extension. Each of the DACs 106 and 108 may have a reset state. With reference to the DAC 106 shown in FIG. 2, for example, the top signals DP_TOP[0 ... N] may each be driven to logic "0" (with a voltage at or near VrefN) so that the upper capacitors 206a-206c are driven to VrefP, and the bottom signals DP_BOT[0 ... N] may each be driven to logic "1" (with a voltage at or near VrefP) so that the lower capacitors 210a-210c are driven to VrefN. Instead of sampling while the DACs 106 and 108 are in their reset states according to the conventional configuration, one or more up to all of the DP_TOP[i] or DN_TOP[i] signals instead may be driven to logic "1" or one or more up to all of the DP_BOT[i] or DN_BOT[i] signals may instead be driven to logic "0" to place the corresponding DAC in a preset state for sampling. After sampling, the DP[i] and DN[i] control signals are reset back to their initial values to "reset" the DACs 106 and 108 while charged with a sampled input value. The SAR and range extension controller 112 then performs normal SAR conversion by adjusting DP[i] and DN[i] one bit at a time while monitoring CMP to eventually develop the digital value PDOUT. The preset value that was added during sampling is then subtracted from PDOUT to provide DOUT as the adjusted output value. The revised operation overcomes the deficiencies of the conventional operation of the differential CR-SAR ADC 100 to achieve substantial range extension.

Figure 3:
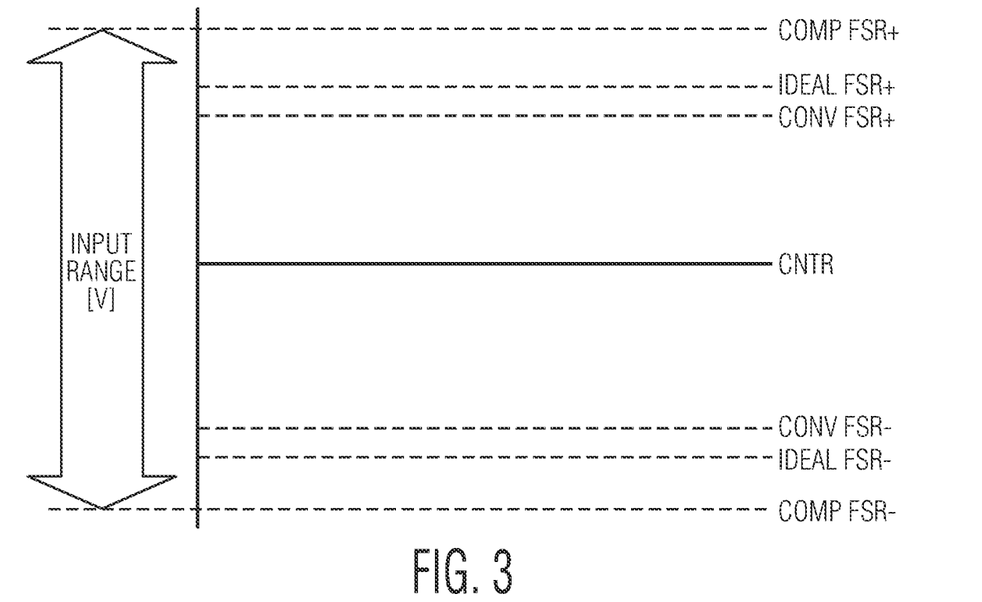
FIG. 3 is a graphic diagram plotting the FSR range for a conventional configuration, an "ideal" configuration, and a compensated FSR configuration with range extension as further described herein according to one embodiment.

FIG. 3 is a graphic diagram plotting the FSR range for a conventional configuration, an "ideal" configuration, and a compensated FSR configuration with range extension as further described herein according to one embodiment. The input range is centered around a center voltage shown as CNTR. The ideal FSR range is between an upper voltage IDEAL FSR+ and a lower voltage IDEAL FSR− with an overall range of $FSR_{IDEAL}$, which may be the same as the extents of the reference voltage VrefP and VrefN, respectively. CNTR may be 0 for a differential configuration. In a single-ended configuration, IDEAL FSR− may be zero (or some other convenient reference voltage level) while CNTR is $FSR_{IDEAL}/2$.

The conventional configuration with top-plate sampling is limited to a reduced voltage range between an upper voltage CONV FSR+ and a lower voltage CONV FSR−. The overall FSR for the conventional configuration, $FSR_{CONV}$, may be represented by the following equation (1):

$$FSR_{CONV} = 2 * \frac{\frac{C_{DACT}}{2}}{C_{DACT} + C_P} \quad (1)$$

in which $C_{DACT}$ is the total capacitance of the DAC. Compared with $FSR_{IDEAL}=1$ (Equation (1) with $C_P=0$), the presence of the parasitic capacitance $C_P$ reduces the overall range for the conventional configuration to less than 1. In many practical configurations, $C_P$ is relatively large so that $FSR_{CONV}$ is generally about 70%-90% of $FSR_{IDEAL}$.

When operating with range extension as described herein, the operative range is extended to a range between an upper voltage COMP FSR+ and a lower voltage COMP FSR−. The overall FSR for the compensated configuration, $FSR_{COMP}$, may be represented by the following equation (2):

$$FSR_{COMP} = 2 * \frac{\frac{C_{DACT}}{2} + C_{DACP}}{C_{DACT} + C_P} \quad (2)$$

where $C_{DACP}$ is an equivalent preset capacitance value of the DAC. In this manner, depending upon the value of $C_{DACP}$, $FSR_{COMP}$ may be increased relative to $FSR_{CONV}$ and may even exceed $FSR_{IDEAL}$ by a significant amount. In one embodiment, for example, $FSR_{COMP}$ may be increased relative to $FSR_{IDEAL}$ by 50% or more. In conventional configurations of a top sampling SAR ADC, if the analog input voltage rises above the practical FSR, usually the input voltage is divided down before the conversion cycle starts to fit the practical extents of FSR which decreases the SNR. In the compensated SAR ADC as described herein, the DAC is preset and the unmodified input voltage is sampled, and then the resulting first output digital value is adjusted by subtracting the preset factor to achieve a compensated digital output value.

It is noted that the embodiments are described herein for a differential configuration, where it is understood that range extension as described herein is equally applicable to single-ended configurations. A single-ended CR-SAR ADC may be configured in a similar manner as the differential CR-SAR ADC 100 except with a single DAC. The lower reference voltage VrefN may be replaced by a singular reference voltage level, which is typically ground or zero (0) volts (V). With reference to FIG. 3, the IDEAL FSR− voltage for the differential configuration is VrefN which has the same magnitude as IDEAL FSR+ with an opposite polarity, whereas the IDEAL FSR− voltage for the single-ended configuration may be 0V. The CNTR voltage for the differential configuration may be at or near 0V, whereas CNTR is FSR/2 for the single-ended configuration. Otherwise, the operative concepts are substantially the same.

Figure 4:
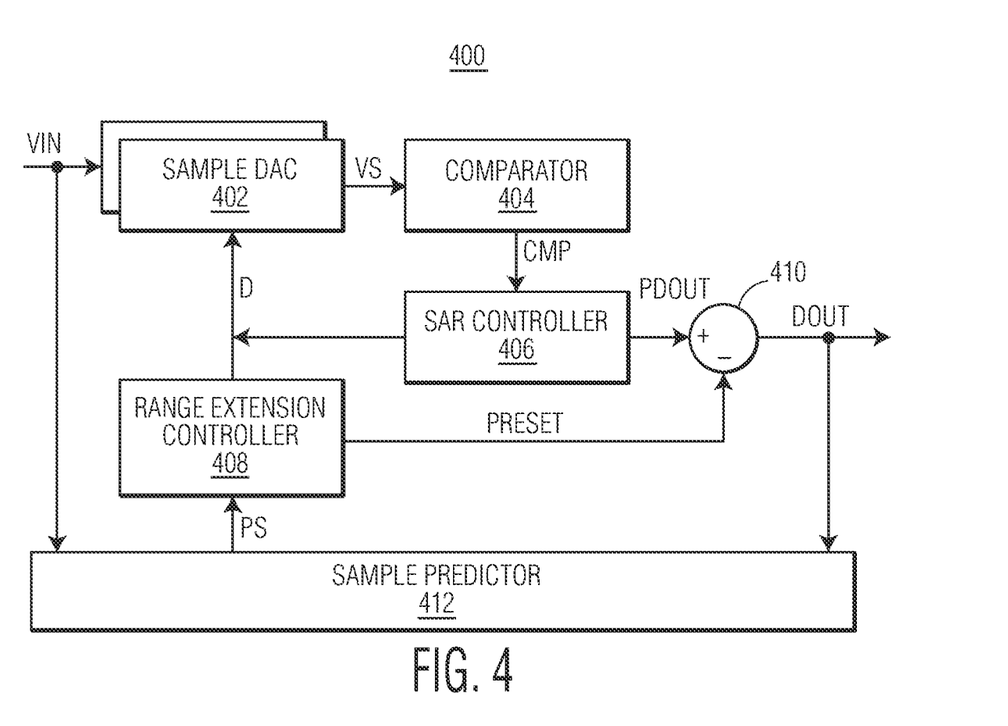
FIG. 4 is a simplified block diagram of a differential CR-SAR ADC configured with input range extension according to one embodiment.

FIG. 4 is a simplified block diagram of a differential CR-SAR ADC 400 configured with input range extension according to one embodiment. In one embodiment, the SAR and range extension controller 112 may be separately configured as a SAR controller 406 and a range extension controller 408. The analog input signal VIN is provided to an input of a sample DAC 402, which provides a sample voltage to a comparator 404. Based on a comparison of VS with a reference voltage Vref (e.g., VS+/− with VRefP/N), the comparator 404 provides an input compare value CMP to an input of the SAR controller 406. The range extension controller 408 initially provides the digital control input signals D to apply a preset value to the sample DAC 402, then prompts the sample DAC 402 to sample VIN while the sample DAC 402 is preset, and then resets the digital control input signals D of sample DAC 402. The range extension controller 408 then prompts the SAR controller 406 to perform the SAR conversion process by adjusting the digital control input signals D, one bit at a time, based on CMP to develop a digital output PDOUT. PDOUT is provided to one input of a digital adder 410, which receives a PRESET value from the range extension controller 408. The PRESET value corresponds with the preset value of the sample DAC 402. The adder 410 subtracts PRESET from PDOUT to provide the adjusted or final digital output value DOUT. The ADC 400 includes a sample predictor 412 which receives either one or both VIN and DOUT and generates a predicted sample signal PS which is provided to the range extension controller 408 during each sample cycle. The range extension controller 408 determines the preset value used to preset the sample DAC 402 for each sample cycle. The entire process is repeated in successive sample cycles.

The sample DAC 402 may be implemented as a differential DAC including a pair of DACs which are configured in a similar manner as the DACs 106 and 108, which in turn may be configured in a similar manner as the top-sampling differential split-capacitor DAC shown in FIG. 2. In the differential configuration, VIN and VS are differential signals and the digital control signals D may be subdivided into two pairs of top and bottom control signals in a similar manner previously described. The sample DAC 402 may also include a pair of sample switches that are configured to operate in substantially the same manner as the sample switches 102 and 104 previously described. In a single-ended configuration, VIN and VS are single-ended signals referenced to ground or the like and the sample DAC 402 may include a single top-sampling DAC.

The sample predictor 412 may be configured to generate PS based on the last sample of VIN as indicated by DOUT. In addition, the sample predictor 412 may perform some level of statistical analysis and slope measurement to determine the direction and rate of change of VIN for determining then next PS on a sample cycle by cycle basis. The range extension controller 408 uses PS to determine the preset value applied to the sample DAC 402 on a sample cycle by cycle basis. In some embodiments, the preset may be zero or not applied if and when VIN is well within the conventional FSR, such as at or near CNTR (FIG. 3). In some embodiments, the preset may be zero or not applied if and when VIN is not sufficiently close to the outer range limits of the sample DAC 402. Alternatively, the preset value may be determined to cause the sample DAC 402 to reset as close to CNTR as possible for the sample DAC 402 after sampling VIN. In some embodiments, when clipping is detected such that VIN exceeds the normal range of the sample DAC 402, the range extension controller 408 may apply a large preset up to a maximum preset in an attempt to cause the sample DAC 402 to reset well within the conventional FSR after sampling VIN.

Figure 5:
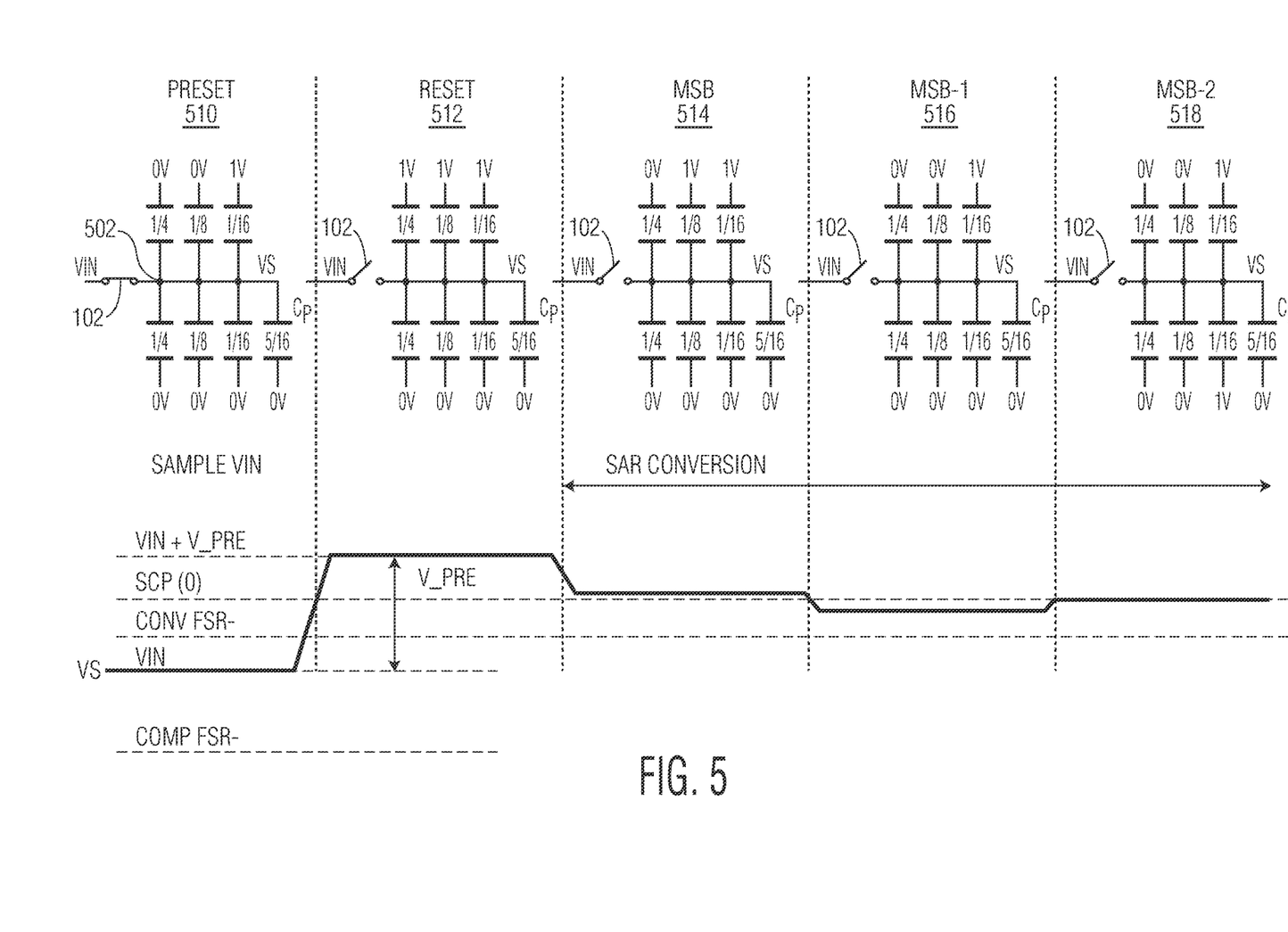
FIG. 5 is a figurative diagram showing five operating phases of a simplified depiction of the sample DAC of the ADC of FIG. 4 with the first three most significant bits (MSBs) and a plot of the voltage VS of a sample node according to one embodiment.

FIG. 5 is a figurative diagram showing five operating phases of a simplified depiction of the sample DAC 402 of the ADC 400 with the first three most significant bits (MSBs) and a plot of the voltage VS of a sample node 502 according to one embodiment. The structure of the sample DAC 402 may be similar to that of the DAC 106 illustrated in FIG. 2 in which the inverting drivers are not shown. Instead, the figurative diagram only illustrates the output voltages as a result of switching of the inverting drivers during each of the operating phases of the conversion process. Only the first three capacitor stages and the parasitic capacitance $C_P$ are shown where it is understood that additional capacitor stages may be included. The capacitor values are illustrated as a ratio of total capacitance (e.g., 1/4, 1/8, 1/16, etc.) rather than to a capacitance value C. For convenience of illustration, the positive reference VrefP in this example is set to 1V and the negative reference VrefN is set to 0V, where it is understood that alternative reference voltages may be used. The input sample switch 102 is shown coupled to the sample node 502 to facilitate sampling of VIN by the sample DAC 402.

The operating phases include a preset phase 510, a reset phase 512, and a series of phases illustrating a normal SAR conversion process for determining the three MSB bits, including an MSB phase 514, an MSB-1 phase 516, and an MSB-2 phase 518. The reset phase 512 illustrates the control voltages in the reset state of the sample DAC 402 in which the top control voltages are each 1V and the bottom control voltages are 0V. In the first preset phase 510, the range extension controller 408 switches the top control voltages for MSB and MSB-1 from 1V (normal reset state) to 0V to apply a preset value. The plot of VS shows the conventional FSR between CONV FSR− and CONV FSR+ in which VS is less than CONV FSR− but greater than COMP FSR−. The sample predictor 412 estimates the voltage level of VS and outputs PS, and the range extension controller 408 uses PS to determine a preset value V_PRE, which, in this case, means switching both MSB and MSB-1 bits down as shown. This is considered a "positive" preset value since when reset after sampling VIN, the voltage of VS rises by V_PRE as shown in the reset phase 512.

It is noted that alternative preset values are contemplated in different situations and under different operating conditions. Rather than pushing MSB and MSB-1 low from 1V to 0V as illustrated, any number of MSBs may be switched, such as only one MSB, both MSB and MSB-1, MSB and MSB-1 and MSB-2, etc., up to all of the top bits. When instead a negative preset value is to be applied in the opposite direction from bottom to top in the preset phase, then any number of the bottom voltages may be switched from 0V to 1V, such as MSB, MSB and MSB-1, MSB and MSB-1 and MSB-2, etc., up to all of the bottom bits. In other words, the preset value may have any magnitude based on the resolution or number of DAC bits and may be in either direction, up or down.

In the preset phase 510, after the preset value is applied, the sample switch 102 is toggled to sample VIN into the sample node 502, which drives VS to have the same voltage level as VIN. Operation then advances to the reset phase 512 in which the range extension controller 408 opens the sample switch 102 to allow the sample node 502 to float, and then switches the digital control values and corresponding control voltages back to the reset condition. In the reset condition as illustrated in the reset phase 512, the top control voltages are all returned to 1V and the bottom control voltages remain at 0V. As shown by the plot of VS, this causes the voltage of the sample node 502 to increase by V_PRE to a voltage level VIN+V_PRE which is well within the conventional range of the DAC, meaning above CONV FSR− yet less then CONV FSR+. In this manner, the preset voltage V_PRE has re-positioned the voltage level of VS to enable the DAC to perform conventional SAR conversion.

Once the voltage of VS settles during the reset phase 512, the range extension controller 408 prompts the SAR controller 412 to perform the SAR conversion while the sample switch 102 remains opened. In the next series of phases, the SAR controller 412 determines the DAC bits one bit at a time beginning with MSB in the MSB phase 514. In each conversion phase, the voltage of VS is compared with a SAR conversion point (SCP), which may be differential 0 (e.g., centerpoint voltage between VrefP and VrefN). As shown, the SAR controller 412 detects VS greater than SCP and switches the top control voltage of MSB from 1V to 0V causing a corresponding decrease of VS. The CMP value indicates that VS is still higher than SCP, so that in the next phase MSB-1 516, the SAR controller 412 switches the top control voltage of MSB-1 from 1V to 0V causing a corresponding decrease of VS. The CMP value indicates that VS has fallen below SCP, so that in the next phase MSB-2 518, the SAR controller 412 switches the bottom control voltage of MSB-2 from 0V to 1V causing a corresponding increase of VS. Operation continues for each sequential bit in sequential cycles. In the simplified illustration, operation is completed and VS is at or substantially close to SCP.

Although not shown, the digital value represented by the control bits corresponds with the digital output PDOUT. Referring back to FIG. 4, the digital adder 410 subtracts the PRESET value (which equals or otherwise corresponds with the digital value applied during the preset phase 510 that corresponds with the voltage V_PRE) from PDOUT to determine the adjusted digital output value DOUT. Operation repeats in successive cycles to convert VIN to a series of digital values on DOUT.

Figure 6:
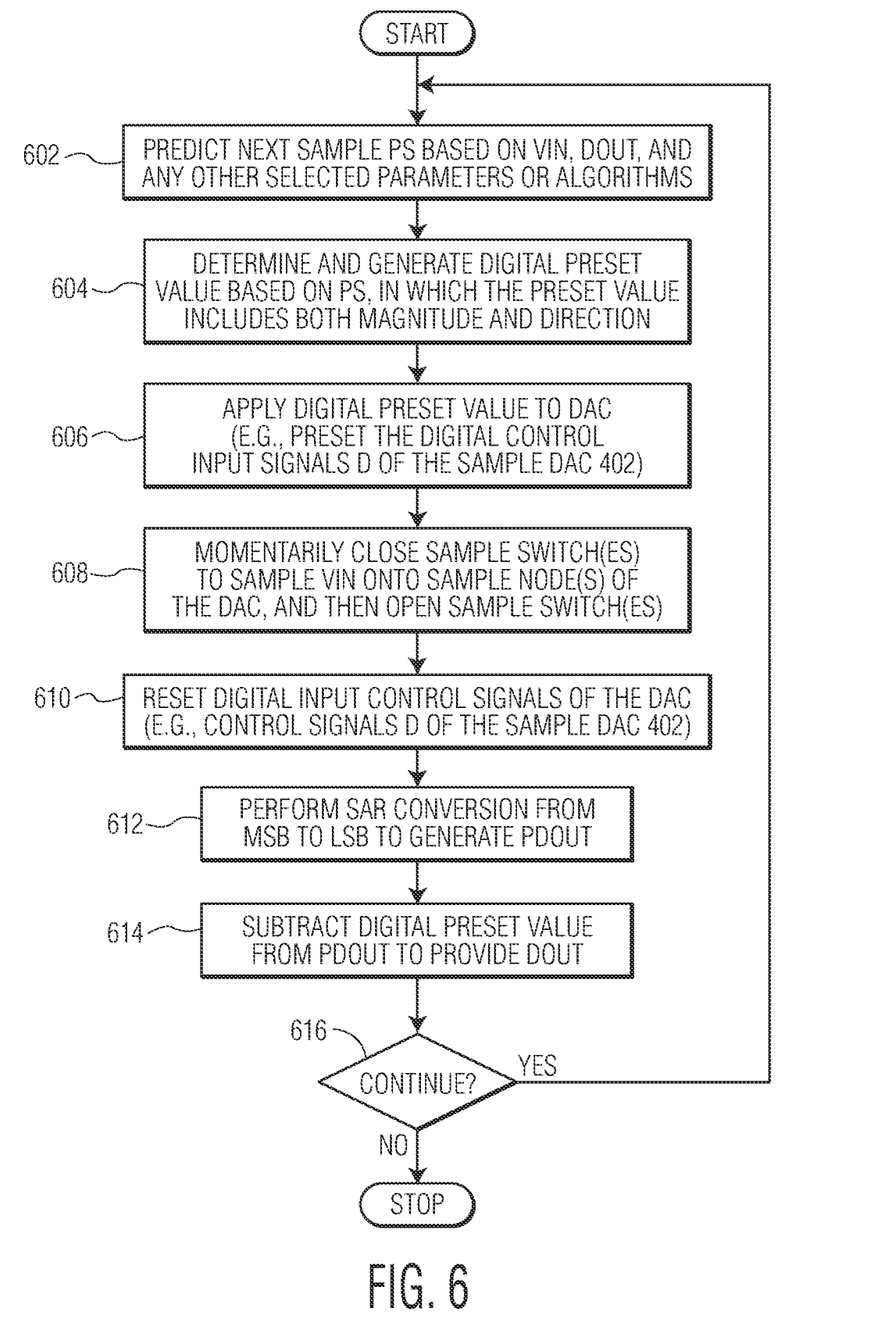
FIG. 6 is a flowchart diagram summarizing operation of the differential CR-SAR ADC of FIG. 4 according to one embodiment.

FIG. 6 is a flowchart diagram summarizing operation of the differential CR-SAR ADC 400 according to one embodiment. At first block 602, the next sample PS is predicted by the sample predictor 412 based on VIN, DOUT, and any other selected parameters and algorithms. Various methods or algorithms are possible for predicting the next sample, which may include estimating the slope and direction of VIN and making a prediction based on the last sampled value of VIN. Operation proceeds to block 604, in which the range extension controller 408 determines and generates a digital preset value based on PS. The digital preset value includes both a magnitude and direction in attempt to adjust the voltage of the sample node at or near CNTR when the DAC is reset after sampling. At next block 606, the range extension controller 408 applies the digital preset value to the DAC (e.g., preset the digital control input signals D of the sample DAC 402). At next block 608, the range extension controller 408 closes one or more sample switches (e.g., 102, 104, etc.) to sample VIN onto the DAC (e.g., onto the respective sample nodes of the DACs 106 and 108, such as, for example, the sample node 202 shown in FIG. 2) while the DAC is still in the preset condition. At next block 610, the range extension controller 408 resets the digital input control signals of the DAC, which effectively applies the preset to place the sample voltage within the conversion range of the DAC. At next block 612, the range extension controller 408 prompts the SAR controller 406 to perform the SAR conversion process one bit at a time from MSB to LSB to generate the digital output value PDOUT. At next block 614, the digital adder 410 subtracts the digital preset value from PDOUT to provide DOUT, and the current conversion cycle is completed. Operation advances to block 616 to query whether to continue the conversion process. If so, operation returns back to block 602 and the conversion process is performed again for the next sample of VIN. Operation may continue in this manner to convert VIN into a series of digital values on DOUT.

Figure 7:
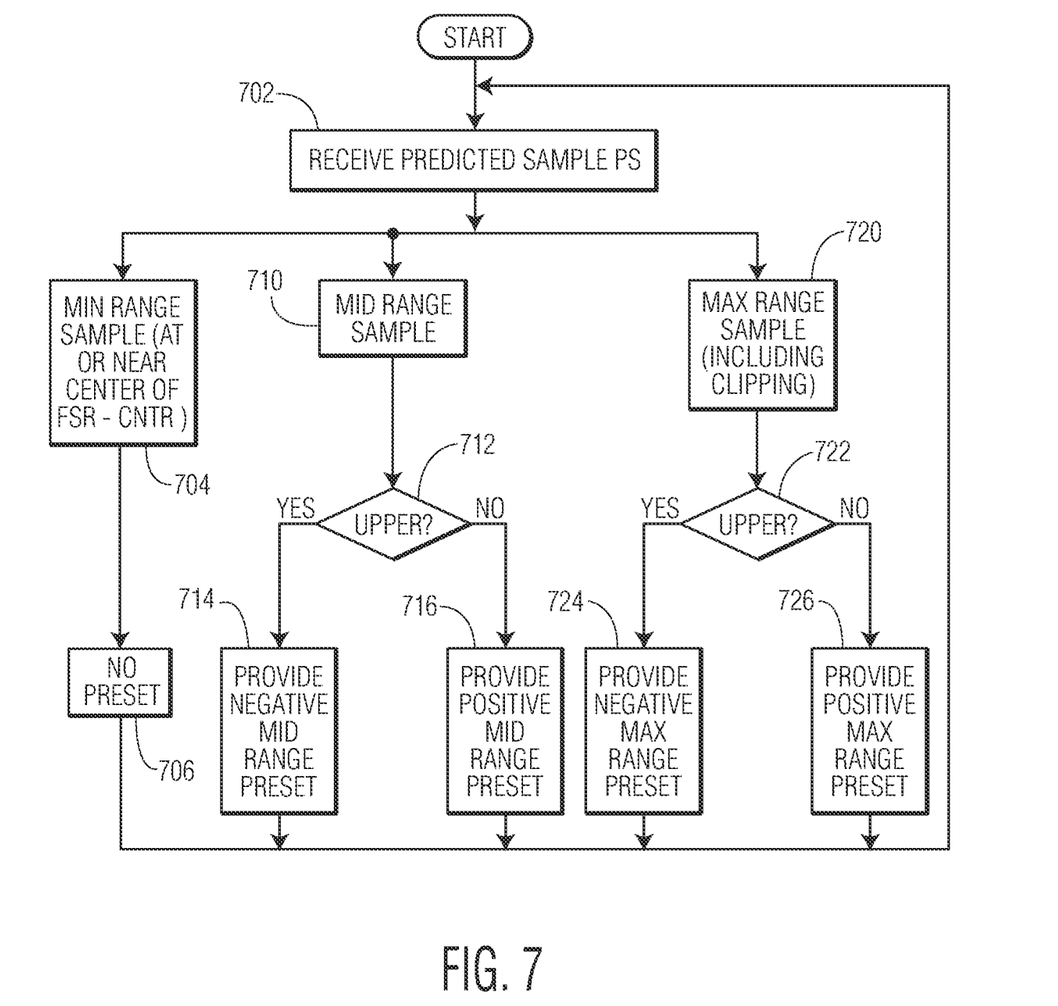
FIG. 7 is a flowchart diagram illustrating operation of the range extension controller of FIG. 4 determining the digital offset during operation illustrated in FIG. 6 according to one embodiment.

FIG. 7 is a flowchart diagram illustrating operation of the range extension controller 408 determining the digital preset value (or digital offset) at block 604 according to one embodiment. At first block 702, the range extension controller 408 receives the predicted sample PS from the sample predictor 412. Depending upon the magnitude of PS, operation advances to one of several blocks, shown as blocks 704, 710, and 720. When PS indicates a minimum (MIN) range sample at or near CNTR which is the center of FSR as determined at block 704, then operation advances to block 706 in which no digital preset value is applied or the preset is effectively zero. In this case, the sample DAC is simply set to its reset condition in the preset phase 510 while VIN is sampled, and the control voltages remain unmodified during the reset phase 512 when the sample switch is opened. Thereafter, operation is the same. Operation then loops back to block 702 for the next sample cycle.

When PS indicates a middle (MID) range sample such as approaching but not exceeding the FSR as determined at block 710, then operation advances to block 712 to determine the direction of the preset. At block 712, it is queried whether the sample is near the positive or upper extent FSR+ of the DAC range. If so, then operation proceeds to block 714 in which the range extension controller 408 generates and provides a negative MID range preset. In this case, the digital preset value may be a negative value such that when the DAC transitions from preset to its reset mode, the sample voltage VS of the sample node decreases at or towards the CNTR of the DAC voltage range. Otherwise, the sample is near the lower extent FSR− and operation proceeds to block 716 in which the range extension controller 408 generates and provides a positive MID range preset so that when the DAC transitions from preset to its reset mode, the sample voltage VS of the sample node increases at or towards the CNTR of the DAC voltage range. After either block 714 or 716, operation loops back to block 702 for the next sample cycle.

When PS indicates a maximum (MAX) range sample between at or near either maximum extent or even outside the FSR range as determined at block 720, then operation advances to block 722 to determine the direction of the preset. At block 722, it is queried whether the sample is at or above the positive or upper extent FSR+ of the DAC range. If so, then operation proceeds to block 724 in which the range extension controller 408 generates and provides a negative MAX range preset. In this case, the digital preset value may be a negative value such that when the DAC transitions from preset to its reset mode, the sample voltage VS of the sample node decreases at or towards the CNTR of the DAC voltage range. Otherwise, the sample is at or exceeds the lower extent FSR− and operation proceeds to block 726 in which the range extension controller 408 generates and provides a positive MAX range preset so that when the DAC transitions from preset to its reset mode, the sample voltage VS of the sample node increases at or towards the CNTR of the DAC voltage range. After either block 724 or 726, operation loops back to block 702 for the next sample cycle.

Many variations are possible and contemplated. In one alternative embodiment, the preset value is calculated in each sample cycle to offset the predicted value to as close to the center value CNTR as possible given the resolution of the DAC. In a slight variation, when PS is at or very near CNTR (e.g., within a minimum threshold empirically determined), either no preset is applied or a predetermined minimum preset may be used in a direction indicated by PS. In another alternative embodiment, additional ranges may be defined with corresponding preset determined for each defined range, in which the presets are used to offset the initial value back to or sufficiently near CNTR after DAC reset. In yet another alternative embodiment, presets are not used unless and until PS indicates that VIN is at or extended beyond FSR (above FSR+ or below FSR−), in which case a maximum preset is applied in the appropriate direction to ensure that the voltage of the sample node is within FSR after DAC reset.

In any of the embodiments, when clipping is detected such that VIN is outside the FSR of the DAC, a maximum digital offset may be applied to preset the DAC when sampling VIN so that the voltage of the sample node with within FSR of the DAC after DAC reset. In this manner, VIN remains unmodified so that SNDR and the corresponding effective number of bits (ENOB) remains unmodified.

Figure 8:
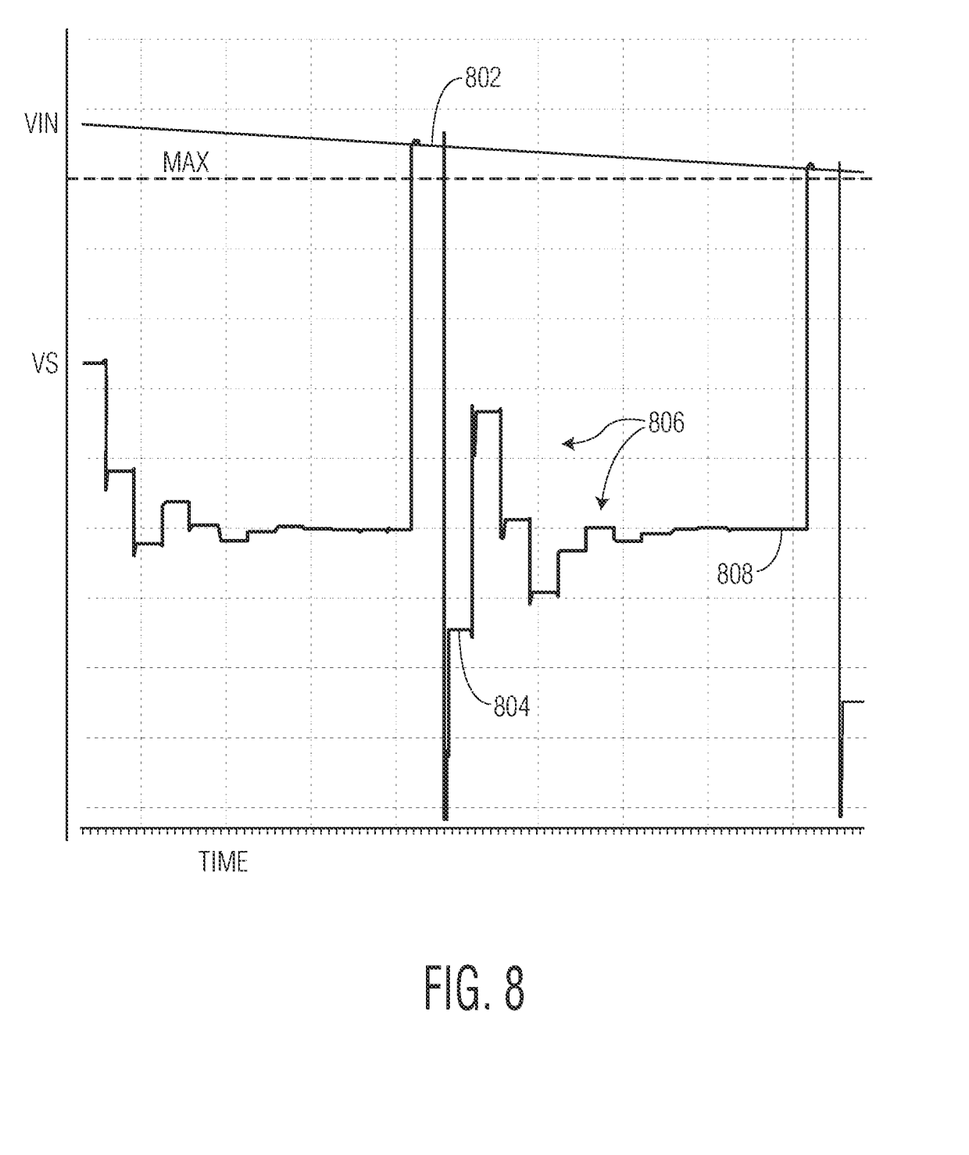
FIG. 8 is a graphic diagram plotting an exemplary VIN signal, the voltage VS of a sample node of a differential CR-SAR ADC and a maximum range of the top-sample DAC of the ADC according to one embodiment.

FIG. 8 is a graphic diagram plotting an exemplary VIN signal, the voltage VS of a sample node of a differential CR-SAR ADC (e.g., 400), and a maximum value MAX indicating the maximum positive range of the top-sample DAC of the ADC according to one embodiment. As shown at 802, VIN is above MAX, which means that the DAC would not be able to properly converge during a normal SAR conversion. In a conventional configuration, the input voltage would first be scaled down causing a loss of SNDR and a reduction of ENOB. Instead, the ADC first presets the DAC with a negative digital offset and then samples VIN at 802 while preset. In the next clock cycle as shown at 804, the DAC is reset which causes VS to decrease to well within the operating range of the DAC. In the next series of clock cycles as shown at 806, the ADC performs standard SAR conversion to determine the DAC bits from MSB to LSB. The ADC determines a final value as shown at 808 which is used to generate PDOUT. Although not shown, the ADC subtracts the preset value from PDOUT to determine the final adjusted digital output value DOUT. Operation repeats in successive sample cycles.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An analog to digital converter, comprising:
a digital to analog converter (DAC) comprising a sample node coupled to a capacitor array that receives a digital control input;
a comparator that is coupled to compare a voltage of the sample node with a reference voltage to generate an input comparison value; and
a controller that is coupled to preset the digital control input with a preset value, to prompt the DAC to sample the input voltage onto the sample node, to reset the digital control input, and then to perform a conversion by successively adjusting the digital control input based on the input comparison value to determine a digital output.

2. The analog to digital converter of claim 1, further comprising an adder that is coupled to subtract a digital adjust value indicative of the preset value from the digital output to provide an adjusted digital output.

3. The analog to digital converter of claim 1, further comprising an input switch that is coupled to sample the input voltage onto the sample node.

4. The analog to digital converter of claim 1, further comprising:
a sample predictor that is coupled to provide a predicted sample value based on the input voltage; and
wherein the controller is configured to select the preset value based on the predicted sample value.

5. The analog to digital converter of claim 4, wherein the DAC has a full scale range between an upper reference voltage level and a lower reference voltage level, and wherein when the predicted sample indicates that the input voltage is outside the full scale range, the controller is configured to select the preset value so that a voltage of the sample node is adjusted to a voltage within the full scale range when the digital control input is reset.

6. The analog to digital converter of claim 1, wherein the DAC comprises a top-plate sampling DAC.

7. The analog to digital converter of claim 1, wherein the capacitor array comprises a plurality of capacitors each having a first terminal coupled to the sample node and each having a second terminal coupled to an output of a corresponding one of a plurality of drivers, wherein each of the plurality of drivers has an input receiving a corresponding one of a plurality of bits of the digital control input, and wherein each of the plurality of drivers is coupled to drive a corresponding one of the plurality of capacitors to a selected one of first and second differential reference voltages based on a corresponding one of the plurality of bits.

8. The analog to digital converter of claim 1, wherein the DAC has a full scale range between an upper reference voltage level and a lower reference voltage level, and wherein the controller is configured to select the preset value so that a voltage of the sample node is adjusted to a voltage between the upper and lower reference voltage levels when the digital control input is reset.

9. The analog to digital converter of claim 1, wherein the conversion comprises a successive approximation register conversion.

10. The analog to digital converter of claim 1, wherein the controller comprises a range extension controller that is coupled to preset the digital control input with a preset value, to prompt the DAC to sample the input voltage onto the sample node, to reset the digital control input, and to then prompt the conversion, and a successive approximation register controller that is coupled to perform the conversion, when prompted, by successively adjusting the digital control input based on the input comparison value to determine the digital output.

11. A method of converting an analog input voltage to a digital value, comprising:
presetting a digital control input of a digital to analog converter (DAC) with a preset value;
sampling the input voltage onto a sample node of the DAC;
resetting the digital control input of the DAC;
comparing a voltage of the sample node with a reference voltage to generate an input comparison value; and
performing conversion by successively adjusting the digital control input based on the input comparison value to determine a digital output.

12. The method of claim 11, further comprising subtracting a digital adjust value indicative of the preset value from the digital output to provide an adjusted digital output.

13. The method of claim 11, wherein the sampling comprises prompting an input sampling switch.

14. The method of claim 11, further comprising:
predicting a next sample value; and
determining the preset value based on a predicted sample value.

15. The method of claim 14, wherein the determining the preset value comprises determining the preset value so that a voltage of the sample node is adjusted to a voltage within a full scale range of the DAC when the digital control input of the DAC is reset.

16. The method of claim 14, wherein the determining the preset value comprises determining the preset value so that a voltage of the sample node is adjusted as close as possible to a center voltage of a full scale range of the DAC when the digital control input of the DAC is reset.

17. The method of claim 11, further comprising configuring the DAC as a top-plate sampling DAC.

18. The method of claim 11, further comprising configuring the DAC as plurality of capacitors each having a first terminal coupled to the sample node and each having a second terminal coupled to an output of a corresponding one of a plurality of drivers, providing each of the plurality of drivers with an input receiving a corresponding one of a plurality of bits of the digital control input, and configuring each of the plurality of drivers to drive a corresponding one of the plurality of capacitors to a selected one of first and second differential reference voltages based on a corresponding one of the plurality of bits.

19. The method of claim 11, further comprising performing the presetting, sampling, resetting, comparing and performing conversion using a charge redistribution, successive approximation register analog to digital converter.

20. The method of claim 11, wherein the performing conversion comprises performing a successive approximation register conversion.

* * * * *